United States Patent [19]

Thakoor et al.

[11] Patent Number: 5,206,829
[45] Date of Patent: Apr. 27, 1993

[54] THIN FILM FERROELECTRIC ELECTRO-OPTIC MEMORY

[76] Inventors: Sarita Thakoor; Anilkumar P. Thakoor, both of 497 S. El Molino #109, Pasadena, Calif. 91101

[21] Appl. No.: 603,935

[22] Filed: Oct. 24, 1990

[51] Int. Cl.$^5$ .............................................. G11C 11/42
[52] U.S. Cl. .................................... 365/117; 365/145
[58] Field of Search ............... 365/109, 117, 145, 161

[56] References Cited

U.S. PATENT DOCUMENTS

| | | | |
|---|---|---|---|
| 3,855,004 | 12/1974 | Broady | 136/89 |
| 4,051,465 | 9/1977 | Brody | 340/173.2 |
| 4,101,975 | 7/1978 | Brody | 365/117 |
| 4,103,341 | 8/1977 | Brody | 365/117 |
| 4,126,901 | 11/1978 | Brody | 365/120 |
| 4,139,908 | 2/1979 | Brody | 365/117 |
| 4,144,591 | 3/1979 | Brody | 365/228 |
| 4,247,914 | 1/1981 | Brody | 365/109 |
| 4,250,567 | 2/1981 | Brody | 365/109 |
| 4,524,294 | 6/1985 | Brody | 310/311 |

OTHER PUBLICATIONS

Philip S. Brody, "Investigations of Photovoltaic Ferroelectric-Semiconductor Nonvolatile Memory", *HDL-TR-1948 Harry Diamond Laboratories*, Adelphia, Md. 20783, ERADCOM Mar. 1981.

Philip S. Brody & Emanuel Katzen, "New Nonvolatile Memory with RAM Capabilities and Intrinsic Radiation Hardness", *HDL-TM-82-14 Harry Diamond Laboratories*, Adelphia, Md. 20783, ERADCOM, Oct. 1982.

S. J. Martin, M. A. Butler & C. E. Land, "Ferroelectric Optical Image Comparator Using PLZT Thin Films", *Electronic Letters*, vol. 24, 1986-87.

P. S. Brody, "Application of Photovoltiac Effect in Ferroelectrics to Information Storage", Harry Diamond Laboratories, Adelphi, Md. 20783, ERAD-COM  Information made available to inventor Jun. 21, 1990, published date unknown.

Ceal E. Land, "Longitudinal Electrooptic Effects and Photosensitivities of Lead Zirconate Titanate Thin Films", *Journal American Ceramic Society*, Nov. 89, vol. 72, No. 11, pp. 2059-2064.

Philip S. Brody, "Optomechanical Bimorph Actuator", *Ferroelectrics*, '83, vol. 50, pp. 27-32, 1983.

P. S. Brody, "Semiconductor-ferroelectric Nonvolatile Memory Using Anomalous High Photovoltages in Ferroelectric Ceramics", *Applied.Physics Letters*, Feb. 81, vol. 38, No. 3, pp. 153-155.

F. Micheron, J. M. Rouchon & M. Vergnolle, "A Ferroelectric Image Memory", *Ferroelectrics*, 1976, vol. 10, pp. 15-18.

Philip S. Brody & Frank Crowne, "Mechanism for the High Photovoltaic Effect in Ceramic Ferroelectrics", *Journal of Electronic Materials*, 1975, vol. 4, No. 5.

*Primary Examiner*—Joseph A. Popek

[57] ABSTRACT

An electrically programmable, optically readable data or memory cell is configured from a thin film of ferroelectric material, such as PZT, sandwiched between a transparent top electrode and a bottom electrode. The output photoresponse, which may be a photocurrent or photo-emf, is a function of the product of the remanent polarization from a previously applied polarization voltage and the incident light intensity. The cell is useful for analog and digital data storage as well as optoelectric computing. The optical read operation is nondestructive of the remanent polarization. The cell provides a method for computing the product of stored data and incident optical data by applying an electrical signal to store data by polarizing the thin film ferroelectric material, and then applying an intensity modulated optical signal incident onto the thin film material to generate a photoresponse therein related to the product of the electrical and optical signals.

17 Claims, 1 Drawing Sheet

THIN FILM FERROELECTRIC ELECTRO-OPTIC MEMORY

Origin of the Invention

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

The present invention relates to data storage devices, such as analog and digital memories used by and within computer systems, and more particularly to radiation hard, non-volatile data storage devices with non-destructive readout.

2. Description of the Prior Art

Conventional non-volatile memories (NVM's) fall into two broad classes,; archival and interactive. Archival NVM's use magnetic tape, floppy diskettes and hard disks. Interactive NVM's utilize digital integrated circuits (IC's) for electrical storage and read out of data. Such digital IC memories are widely used but have many limitations in terms of speed, density, cyclability and difficulty in configuring massively parallel systems and/or providing interfaces with optical signal handling systems.

Many alternate memory approaches have been proposed and are continuing to be developed. One promising approach has been the development of ferroelectric memory systems in which the remanent polarization of the ferroelectric material is used to store the data. Current approaches to such ferroelectric memory systems have included both bulk and thin film ferroelectric materials but have required destruction of the remanent polarization in order to electronically read or retrieve the data.

A substantial improvement in such systems has been proposed in which bulk ferroelectric materials are used in a ceramic form as a non-volatile memory storage element. In such devices, optical addressing of the data stored produces an electrical output signal without destruction of the remanent polarization.

What is needed, however, is a new approach to memory storage elements providing increased density, electro-optic compatibility, high speed operation, increased cyclability and improved radiation hardness. The new approach should provide non-destructive optical addressing of stored information and overcome the electronic cross talk and pinout limitations inherent in conventional large interconnection arrays.

In addition, computer system architecture design would benefit greatly from the availability of memory systems capable of analog as well as digital data storage ability. The ability to perform some computing functions in the memory, that is, alter the output resulting from a read out of the memory as a controllable function of the input and stored information, would substantially enhance computer architecture design flexibility and performance.

SUMMARY OF THE INVENTION

The preceding and other shortcomings of the prior art are addressed and overcome by the present invention that provides, in a first aspect, a data cell including a transparent top electrode, a bottom electrode, a thin film of ferroelectric material sandwiched therebetween, means for applying a level of remanent polarization to the ferroelectric material, said level being related to an analog value to be stored, and means for applying light having an intensity in a wavelength near the bandgap of the ferroelectric material the light being applied to generate a photoresponse therein a magnitude of which is related to the product of the analog value and the intensity.

In another aspect, the invention provides a method for storing data by polarizing a thin film of ferroelectric material to obtain a level of remanent polarization therein related to an analog value to be stored and applying light to the thin film, the light having a wavelength near the bandgap of the ferroelectric material to generate a photoresponse related to said analog value.

In still another aspect, the invention provides a method for computing the product of stored data and incident data by applying an electrical signal to store analog data in a photoresponsive, polarizable material, by polarizing the material to a level of remanent polarization related to said analog value and then applying an intensity modulated optical signal incident onto the material to generate a photoresponse related to the product of the intensity and the analog value.

The foregoing and additional features and advantages of this invention will become further apparent from the detailed description and accompanying drawing figure or figures that follow. In the figures and written description, numerals indicate the various features of the invention, like numerals referring to like features throughout both the drawing figures and the written description.

DETAILED DESCRIPTION OF THE PREFERRED EMBODIMENT

Figure 1:
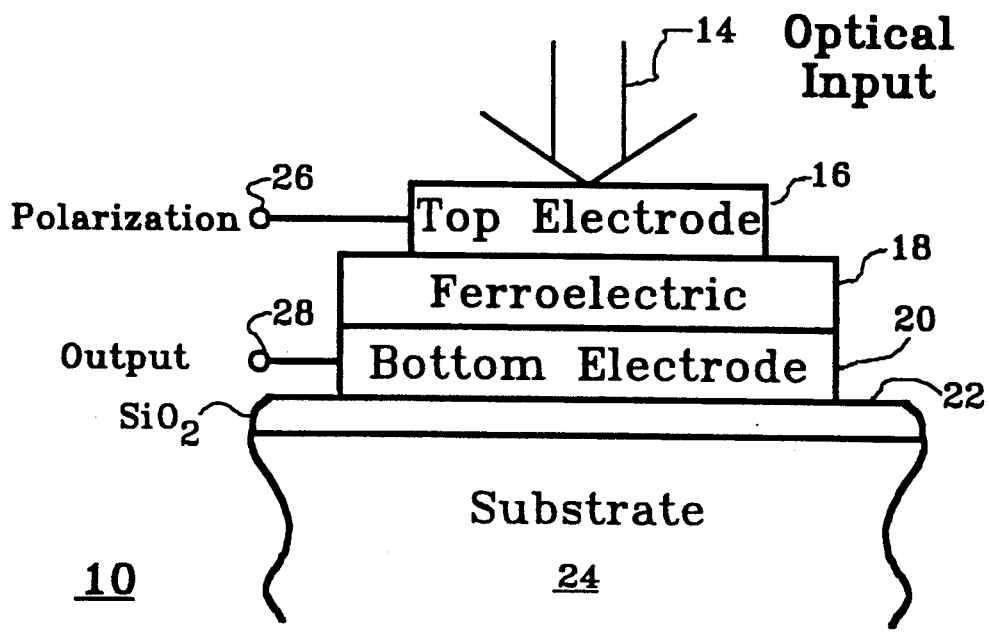
FIG. 1 is a cross sectional view of thin film ferroelectric electro-optical memory cell 10 according to the present invention.

FIG. 1 is a cross sectional view of thin film ferroelectric electro-optical data or memory cell 10 according to the present invention. Thin film ferroelectric layer 18 is sandwiched between transparent top electrode 16 and bottom electrode 20. These electrodes may conveniently be formed on a conventional insulated substrate, such as silicon substrate 24 insulated by an oxide layer such as silicon dioxide, or $SiO_2$, layer 22.

To write data to thin film ferroelectric electro-optical memory cell 10, a polarizing voltage is applied between top electrode connection 26 and bottom electrode connection 28. After removal of the applied polarizing voltage, the remanent polarization of thin film ferroelectric layer 18 represents the stored data. In known ferroelectric electro-optical memory systems, as noted above, the data stored was a binary bit used to represent a digital value. That is, the remanent polarization is either high enough (e.g. above a predetermined threshold) in a first direction, such as vertically up, perpendicular to the plane of thin film ferroelectric layer 18 to represent a first value, (e.g. bit one) or high enough in the opposite direction, such as vertically down, to represent a second value, (e.g. bit zero).

In accordance with the present invention, as will be discussed in greater detail below, the analog value of the remanent polarization may be determined from memory cells. Such cells may therefore be configured for use in analog as well as digital memory value storage.

After removal of the polarization voltage, the data stored in thin film ferroelectric electro-optical memory cell 10 may be read out optically by application of optical input light beam 14. The intensity of optical input light beam 14 may be a fixed constant value or, as described in greater detail below, the intensity of optical input light beam 14 may be modulated to alter the output.

Thin film ferroelectric layer 18, in response to the application of optical input light beam 14, produces an output photoresponse, such as a photocurrent or photoemf, between electrode connections 26 and 28, in accordance with the well known properties of ferroelectric materials.

The magnitude of this output photoresponse represents the magnitude of the stored data. It is important to note that the above described read operation, whether optical input light beam 14 is intensity modulated or has a constant value, is a non-destructive read operation. That is, the application of optical input light beam 4 to read the value of the data stored as the remanent polarization of thin film ferroelectric layer 18 does not alter the magnitude of the polarization. Subsequent read operations may therefore be performed without loss of data integrity and without the requirement of an intervening write operation to restore the data stored, as is the case with current electronically addressed, destructively read ferroelectric data storage devices.

Figure 2:
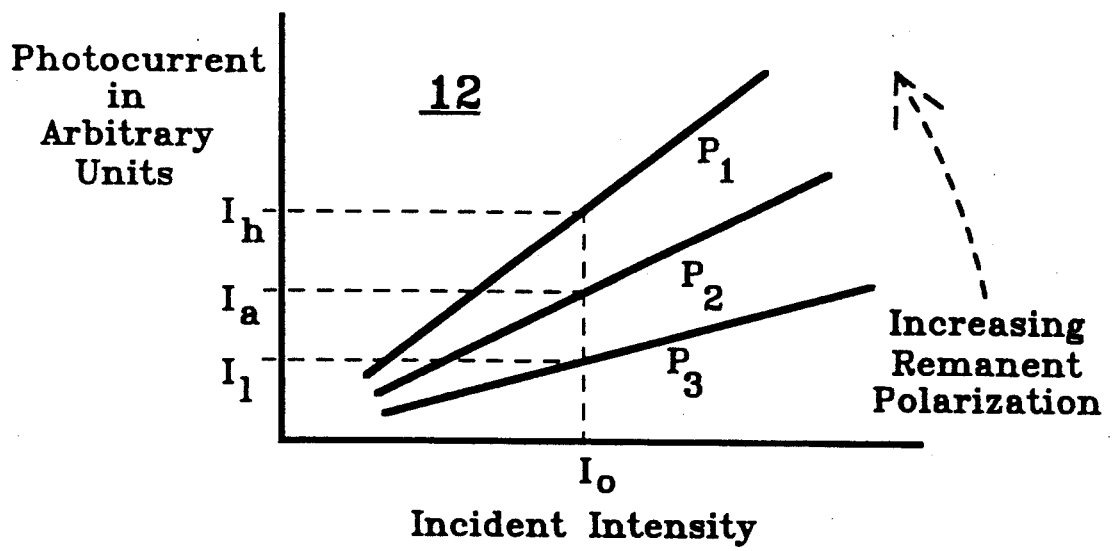
FIG. 2 shows graph 12 which indicates that the output photocurrent of thin film ferroelectric electro-optical memory cell 10 is a function of both input remanent polarization as well as input incident light intensity.

Referring now to FIG. 2, graph 12 shows the relationship between the output photocurrent and the intensity of light incident from optical input light beam 14 as a function of increasing levels of remanent polarization, $P_1$, $P_2$ and $P_3$. As can be seen from FIG. 2, for a fixed value of incident light intensity $L_o$, a remanent polarization value of $P_3$ results in an output photocurrent having a relatively low value, $I_l$. A higher remanent polarization value $P_1$ results in a output photocurrent having a relatively high value, $I_h$.

In accordance with known techniques, a preselected polarizing field may be applied to thin film ferroelectric layer 8 to produce remanent polarization values that will consistently result in either $I_l$ or $I_h$ when read with a relatively fixed value of incident light intensity $L_o$. This permits use of thin film ferroelectric electro-optical memory cell 10 in digital memory systems which may be written electrically and non-destructively read with an optical input signal.

However, as shown in graph 12, for a fixed value of incident light intensity $L_o$, the magnitude of the output photocurrent is a function of the magnitude of the remanent polarization. This magnitude is itself a function of the applied polarizing voltage, i.e. the stored memory.

Thin film ferroelectric electro-optical memory cell 10 may therefore be used as an analog storage element. The analog value to be stored would be applied to thin film ferroelectric electro-optical memory cell 10 via electrode connections 26 and 28. The stored value of the cell would be read by application of a fixed intensity of optical input light beam 14, such as incident light intensity $L_o$. The resultant output photocurrent would then have an analog magnitude, $I_a$, intermediate $I_h$ and $I_l$.

Because the memory cell is read by optical input light beam 14 applied to transparent top electrode 16, cell of the present invention may be utilized in a vast array of such cells which can be selectively read by control of the path of an incident light beam. In addition, multiple optical input light beams 4 may be used to read multiple cells permitting massively parallel memory systems to be easily and conveniently configured.

In addition, to use as an electrically written, non-destructively optically readable digital or analog memory cell, thin film ferroelectric electro-optical memory cell 10 is usable as a digital or analog computing unit. In particular, the analog or digital value stored in cell 10 as a remanent polarization, proportional to a previously applied polarizing field, may be read by a selectable value of optical input light beam 14.

As noted above, the resultant photocurrent output would be proportional to the magnitude of both the remanent polarization as well as the incident light intensity.

This feature of the present invention may be advantageously employed to configure a monolithic analog or digital opto-electronic vector matrix multiplier which forms an output related to the product of an input electrical signal and an input optical signal.

As noted above, however, the incident light intensity need not be fixed at any particular value, but varied as desired. The output photoresponse is a function of the product of the remanent polarization and the incident light intensity. The magnitude of the incident light intensity may therefore be used to represent some other desired value.

This feature of the present invention may be used advantageously to configure optical or opto-electronic computing systems involving large two dimensional (2D) memory arrays. One convenient configuration would utilize a memory array to store individual image pixels. When a new image is made incident on the memory array, the total electronic output from the array would represent the measure of correlation, or match, between the incident and the stored image. The output would be maximum when the incident and stored image match perfectly.

Similarly, this feature of the present invention may be advantageously employed in the creation of large neural networks, such as networks with 2D layers of neurons and synapses, which is not possible with conventional VLSI electronic implementations due to input/output (I/O) limitations, e.g. the number of pins required as well as crosstalk problems.

For example, the non-volatile digital/analog ferroelectric memory array could act as a synaptic memory array. The output from a neuron array could be made incident as an optical pattern onto the ferroelectric synaptic array. The electrical output from the synaptic array will then be a product of the incident neuron input times the stored synaptic memory.

With regard now to a physical embodiment of the present invention, transparent top electrode 6 may conveniently be a layer of deposited gold, platinum, indium tin oxide (ITO) or tin oxide (TO). Thin film ferroelectric layer 18 may conveniently be constructed from a layer of lead zirconate titanate, commonly called PZT, in the range of about 0.05 $\mu$m to 1 $\mu$m thick. Lead lanthanate zirconate titanate (PLZT) also appears suitable for use in constructing thin film ferroelectric layer 18. Platinum may be used for bottom electrode 20.

The incident light should have a wavelength near the bandgap of the ferroelectric material. For PZT, an optical input in the range of about 350 to about 450 nm is preferred. Experimental results have confirmed the suitability of 365 nm laser light for use with a PZT element.

Programming could be as fast as 100 ns using programming voltages in the range of about 5 volts. With incident optical signal intensity in the range of 1 to 100 mW/cm$^2$ and quantum efficiency on the order of 1%, output current signal densities may be achieved in the range of 1 to 100 μA/cm$^2$. Pixels as small as $(10\mu)^2$ should be achievable.

Fast readout could be accomplished using pulsed laser light of appropriate wavelength for pixel by pixel readout. On the other hand, continuous wave lasers with high frequency acousto-optical scanning could also be utilized for readout from such an array. Furthermore, with availability of semiconductor lasers in the desired wavelength range, the readout system could be made extremely compact.

While this invention has been described with reference to its presently preferred embodiments, its scope is not limited thereto. Rather, such scope is only limited in so far as defined by the following set of claims and includes all equivalents thereof.

What is claimed is:

1. A data cell comprising:
   a transparent top electrode;
   a bottom electrode;
   a thin film of ferroelectric material therebetween;
   means for applying a level of remanent polarization to the thin film of ferroelectric material, said level being related to an analog value to be stored; and
   means for applying light to said thin film, said light having a wavelength near the bandgap of the ferroelectric material, said light being applied to generate a photoresponse therein a magnitude of which is related to the product of said analog value and said intensity.

2. The data cell claimed in claim 1, wherein the ferroelectric material is PZT.

3. The data cell claimed in claim 1, wherein the film of ferroelectric material is in the range of about 0.05 μm to 1 μm thick.

4. The data cell claimed in claim 1, wherein the wavelength of the applied light is in the range of about 350 to 450 nm.

5. The data cell claimed in claim 1, wherein the intensity of the applied light is in the range of 1 to 100 mW/cm$^2$.

6. A method for storing and retrieving data, comprising the steps of:
   polarizing a thin film of ferroelectric material to obtain a level of remanent polarization therein related to an analog value to be stored; and
   applying light to said thin film, said light having a wavelength near the bandgap of the ferroelectric material, said light generating a photoresponse therein related to said analog value.

7. The method for storing and retrieving data claimed in claim 6, wherein the ferroelectric material is PZT.

8. The method for storing and retrieving data claimed in claim 6, wherein the film of ferroelectric material is in the range of about 0.05 μm to 1 μm thick.

9. The method for storing and retrieving data claimed in claim 6, wherein the wavelength of the applied light is in the range of about 350 to 450 nm.

10. The method for storing and retrieving data claimed in claim 6, wherein the intensity of the applied light is in the range of 1 to 100 mW/cm$^2$.

11. A method for computing the product of stored data and incident data, comprising the steps of:
    applying an electrical signal to store analog data in a photoresponsive, polarizable material by polarizing the material to a level of remanent polarization related to an analog value; and
    then applying an intensity modulated optical signal incident to the material to generate a photoresponse therein, a magnitude of said photoresponse being related to the product of said intensity and said analog value.

12. The method of claim 11, wherein the material is ferroelectric.

13. The method of claim 12 wherein the material is in the form of a thin film and the wavelength of the incident optical signal is near the bandgap of the ferroelectric material.

14. The method of claim 13 wherein the ferroelectric material is PZT.

15. The method of claim 14, wherein the film is in the range of about 0.05 μm to 1 μm thick.

16. The method of claim 14, wherein the wavelength of the applied light is in the range of about 350 to 450 nm.

17. The method of claim 14, wherein the intensity of the applied light is in the range of 1 to 100 mW/cm$^2$.

* * * * *